US012694913B2

(12) United States Patent
Harris

(10) Patent No.: US 12,694,913 B2
(45) Date of Patent: Jul. 28, 2026

(54) REDUCED LOGIC GATE ACCUMULATORS

(71) Applicant: Raytheon Company, Tewksbury, MA (US)

(72) Inventor: Micky R. Harris, Lompoc, CA (US)

(73) Assignee: Raytheon Company, Arlington, VA (US)

( * ) Notice: Subject to any disclaimer, the term of this patent is extended or adjusted under 35 U.S.C. 154(b) by 245 days.

(21) Appl. No.: 18/663,768

(22) Filed: May 14, 2024

(65) Prior Publication Data

US 2025/0022493 A1 Jan. 16, 2025

Related U.S. Application Data

(60) Provisional application No. 63/526,378, filed on Jul. 12, 2023.

(51) Int. Cl.
G11C 7/08 (2006.01)
G11C 7/10 (2006.01)
H04N 25/707 (2023.01)

(52) U.S. Cl.
CPC .............. G11C 7/08 (2013.01); G11C 7/1012 (2013.01); G11C 7/1069 (2013.01); G11C 7/1096 (2013.01); H04N 25/707 (2023.01)

(58) Field of Classification Search
CPC ....... G11C 7/08; G11C 7/1012; G11C 7/1069; G11C 7/1096; H04N 25/707
See application file for complete search history.

(56) References Cited

U.S. PATENT DOCUMENTS

| | | | |
|---|---|---|---|
| 3,969,634 A | 7/1976 | Su et al. | |
| 4,761,606 A | 8/1988 | Germer et al. | |
| 5,972,076 A | 10/1999 | Nichols et al. | |
| 6,091,531 A | 7/2000 | Schwartz et al. | |
| 6,169,444 B1 | 1/2001 | Thurber, Jr. | |
| 6,492,830 B1 | 12/2002 | Ju et al. | |
| 6,512,411 B2 | 1/2003 | Meng et al. | |
| 6,781,434 B2 | 8/2004 | Jensen et al. | |
| 6,954,888 B2 | 10/2005 | Rajski et al. | |
| 8,009,077 B1 | 8/2011 | Melanson | |
| 8,098,316 B2 | 1/2012 | Parks | |
| 8,102,455 B2 | 1/2012 | Parks | |
| 8,519,879 B1 | 8/2013 | Denham | |
| 8,750,060 B2 | 6/2014 | Denham | |

(Continued)

OTHER PUBLICATIONS

Wikipedia, "Linear-feedback shift register", Mar. 2023, 24 pages.

*Primary Examiner* — Nicholas G Giles

(57) ABSTRACT

An apparatus includes a memory having memory elements configured to store bits of a count value. The apparatus also includes sense amplifiers configured to read the bits of the count value from the memory elements and write amplifiers configured to write the bits of the count value to the memory elements. The apparatus further includes at least one logic gate configured to generate at least one feedback bit based on the count value stored in the memory elements. Some of the sense amplifiers are coupled to some of the write amplifiers in order to read and shift a subset of the bits of the count value and store the shifted subset of the bits of the count value in the memory. The shifted subset of the bits of the count value and the at least one feedback bit form an updated count value in the memory elements.

20 Claims, 5 Drawing Sheets

(56)        References Cited

U.S. PATENT DOCUMENTS

| | | | |
|---|---|---|---|
| 8,976,586 B2 | 3/2015 | Nagai et al. | |
| 9,154,713 B2 | 10/2015 | Denham et al. | |
| 10,362,254 B2 * | 7/2019 | Kelly | G11B 20/00086 |
| 11,693,099 B2 * | 7/2023 | Dussan | G01S 7/4863 |
| | | | 356/5.01 |
| 11,894,670 B2 | 2/2024 | Boemler | |
| 12,259,498 B2 * | 3/2025 | Henderson | G01S 7/484 |
| 2003/0206236 A1 | 11/2003 | Levantovsky | |
| 2004/0036643 A1 | 2/2004 | Bock | |
| 2010/0140732 A1 | 6/2010 | Eminoglu et al. | |
| 2010/0194956 A1 | 8/2010 | Yuan et al. | |
| 2011/0215222 A1 | 9/2011 | Eminoglu et al. | |
| 2012/0006971 A1 | 1/2012 | Pflibsen et al. | |
| 2014/0061442 A1 | 3/2014 | Denham | |
| 2017/0026603 A1 * | 1/2017 | Kelly | G11B 20/00086 |
| 2020/0264286 A1 * | 8/2020 | Dussan | G01S 7/4817 |
| 2021/0231782 A1 * | 7/2021 | Henderson | H04N 25/773 |

* cited by examiner

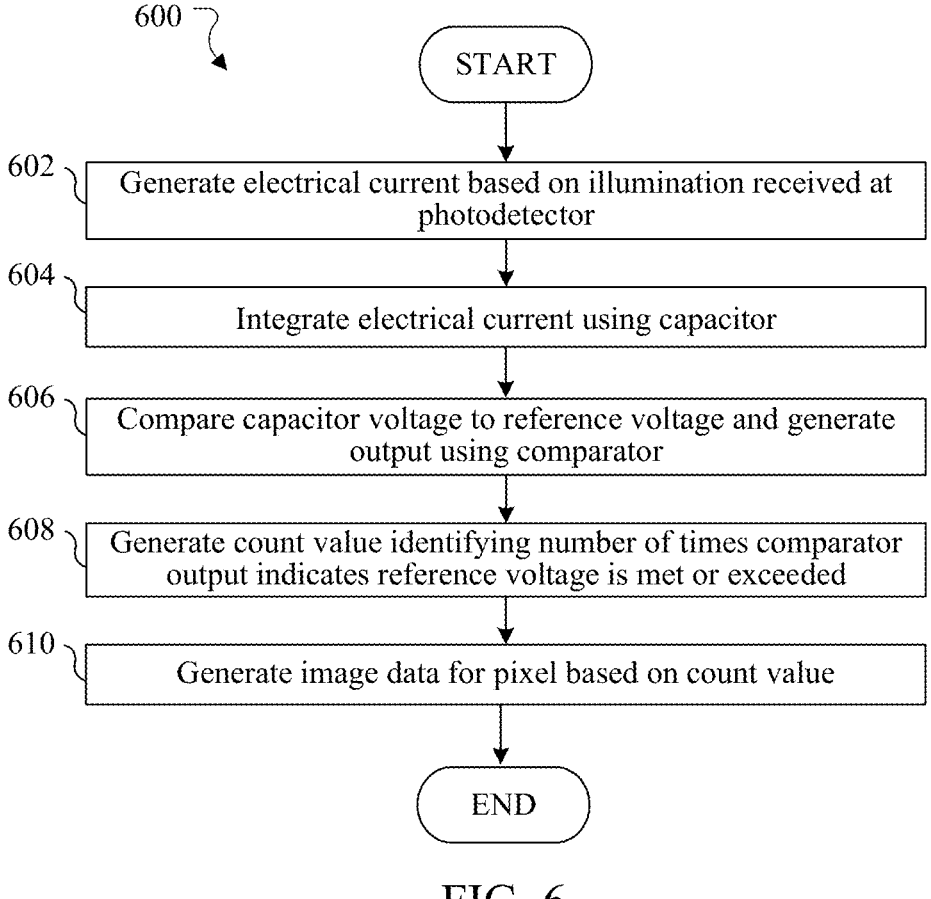

600

START

602 — Generate electrical current based on illumination received at photodetector 604 — Integrate electrical current using capacitor 606 — Compare capacitor voltage to reference voltage and generate output using comparator 608 — Generate count value identifying number of times comparator output indicates reference voltage is met or exceeded 610 — Generate image data for pixel based on count value

END

FIG. 6

REDUCED LOGIC GATE ACCUMULATORS

CROSS-REFERENCE TO RELATED APPLICATION AND PRIORITY CLAIM

This application claims priority under 35 U.S.C. § 119(e) to U.S. Provisional Patent Application No. 63/526,378 filed on Jul. 12, 2023. This provisional application is hereby incorporated by reference in its entirety.

TECHNICAL FIELD

This disclosure relates generally to electrical circuits. More specifically, this disclosure relates to reduced logic gate accumulators.

BACKGROUND

Imaging systems often use digital pixels to capture information when generating images. For example, in each digital pixel, an electrical current from a photodetector can be used to charge an integration capacitor during a sampling period, and the voltage stored on the integration capacitor can be compared to a reference voltage. When the reference voltage is met or exceeded, the integration capacitor can be discharged. At that point, the electrical current from the photodetector can again be used to charge the integration capacitor. The number of times that the integration capacitor is charged and reset during the sampling period can be counted and used to generate image data for that digital pixel. This process can be performed for each digital pixel in an imaging array in order to generate image data for the array.

SUMMARY

This disclosure relates to reduced logic gate accumulators.

In a first embodiment, an apparatus includes a memory having memory elements configured to store bits of a count value. The apparatus also includes sense amplifiers configured to read the bits of the count value from the memory elements and write amplifiers configured to write the bits of the count value to the memory elements. The apparatus further includes at least one logic gate configured to generate at least one feedback bit based on the count value stored in the memory elements. Some of the sense amplifiers are coupled to some of the write amplifiers in order to read and shift a subset of the bits of the count value and store the shifted subset of the bits of the count value in the memory. The shifted subset of the bits of the count value and the at least one feedback bit form an updated count value in the memory elements.

In a second embodiment, a system includes a first digital pixel configured to generate pulses and a first accumulator configured to count a number of pulses generated by the first digital pixel. The first accumulator includes a memory having memory elements configured to store bits of a count value. The first accumulator also includes sense amplifiers configured to read the bits of the count value from the memory elements and write amplifiers configured to write the bits of the count value to the memory elements. The first accumulator further includes at least one logic gate configured to generate at least one feedback bit based on the count value stored in the memory elements. Some of the sense amplifiers are coupled to some of the write amplifiers in order to read and shift a subset of the bits of the count value and store the shifted subset of the bits of the count value in the memory. The shifted subset of the bits of the count value and the at least one feedback bit form an updated count value in the memory elements.

In a third embodiment, a method includes storing bits of a count value in memory elements of a memory, reading the bits of the count value from the memory elements using sense amplifiers, and writing the bits of the count value to the memory elements using write amplifiers. The method also includes generating at least one feedback bit based on the count value stored in the memory elements using at least one logic gate. In addition, the method includes updating the count value by using some of the sense amplifiers and some of the write amplifiers to read and shift a subset of the bits of the count value and store the shifted subset of the bits of the count value in the memory. The shifted subset of the bits of the count value and the at least one feedback bit form an updated count value in the memory elements.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIG. 6 illustrates an example method for operating a digital pixel of a digital pixel array using a reduced logic gate accumulator according to this disclosure.

DETAILED DESCRIPTION

Figure 1:
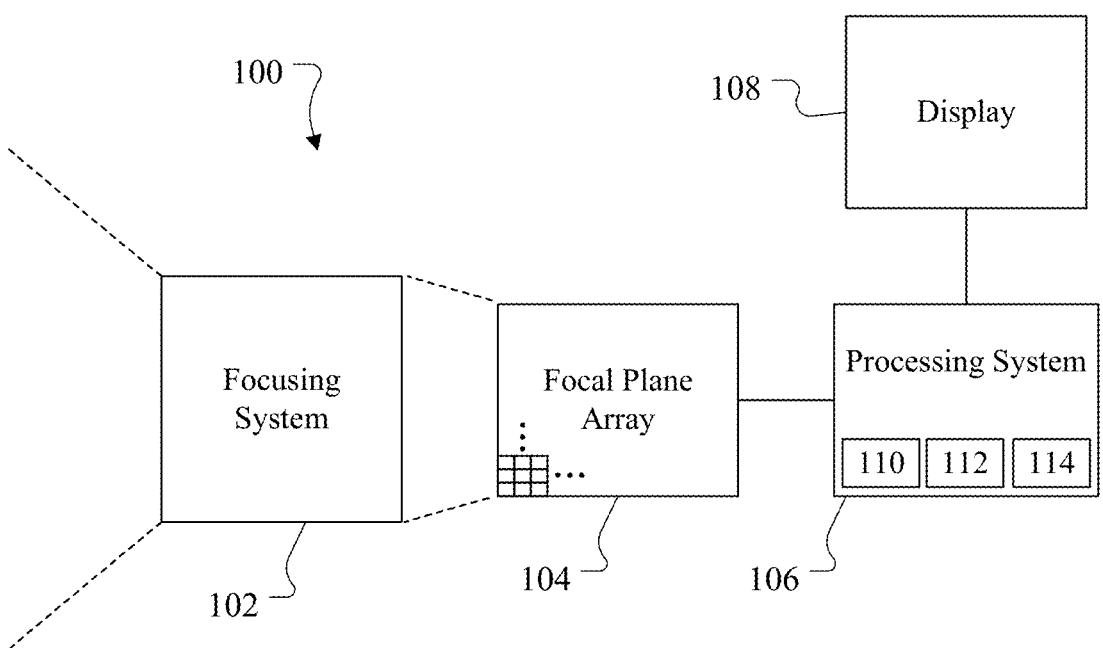
FIG. 1 illustrates an example system supporting the use of a digital pixel array according to this disclosure.

FIGS. 1 through 6, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, imaging systems often use digital pixels to capture information when generating images. For example, in each digital pixel, an electrical current from a photodetector can be used to charge an integration capacitor during a sampling period, and the voltage stored on the integration capacitor can be compared to a reference voltage. When the reference voltage is met or exceeded, the integration capacitor can be discharged. At that point, the electrical current from the photodetector can again be used to charge the integration capacitor. The number of times that the integration capacitor is charged and reset during the sampling period can be counted and used to generate image data for that digital pixel. This process can be performed for each digital pixel in an imaging array in order to generate image data for the array.

A repartitioned digital pixel (RDP) array refers to an array of digital pixels in which the array is divided or partitioned into separate components, which may or may not be physically co-located. For example, a "front-end" circuit of each digital pixel in the array may include an integration capacitor, a comparator that senses when a voltage stored on the integration capacitor meets or exceeds a reference voltage, a charge removal circuit (such as a switch coupled across the integration capacitor) for discharging the integration capacitor, and optionally biasing circuitry. A "back-end" circuit of each digital pixel in the array may include a digital counter that counts the number of times that the integration capacitor meets or exceeds the reference voltage, a read-out circuit, and optionally one or more storage or "snapshot" registers. In a repartitioned digital pixel array, the front-end circuits of the digital pixels may be spatially and conceptually separated and relocated from the back-end circuits of the digital pixels.

Some approaches for implementing a repartitioned digital pixel array use random access memory (RAM) as memory elements for digital pixels, where adders are used to implement accumulators. In these approaches, a current count value for each digital pixel is stored in memory elements of the RAM, and an adder is used to increment or otherwise increase the count value. Unfortunately, these tend to be rather large circuits. For example, using a half adder per bit in an accumulator typically requires the use of eight XOR gates for eight-bit count values. As a result, implementing these circuits in a repartitioned digital pixel array or other system that uses a large number of accumulators may require a large amount of space. In some instances, this may actually limit usage of the RAM to the periphery of a repartitioned digital pixel array. Moreover, the RAM can be shared by all of the digital pixels in the repartitioned digital pixel array, and the sharing of the RAM and the positioning of the RAM away from the digital pixels can significantly increase power usage. This is because (i) there is a need for increased speed in order to enable sampling of more and more digital pixels and (ii) capacitive loads on electrical pathways coupling the digital pixels and the RAM increase as the electrical pathways get longer and more digital pixels are coupled to the electrical pathways.

This disclosure provides reduced logic gate accumulators, which can be used in repartitioned digital pixel arrays, other digital pixel arrays, or other circuits. As described in more detail below, each reduced logic gate accumulator can store an accumulated count value as an encoded value in memory elements of a random access memory, such as when the encoded value represents a value encoded using linear-feedback shift register (LFSR) encoding or Johnson encoding. When the accumulated count value needs to be incremented or otherwise increased, a current accumulated count value can be read from the random access memory using sense amplifiers and used to generate an updated accumulated count value, and the updated accumulated count value can be stored back in the random access memory using write amplifiers. In some cases, the updated accumulated count value may be generated using a single XOR gate, along with appropriate taps that enable routing of certain bit values of the current accumulated count value to the XOR gate. This can reduce the accumulation logic for each accumulator to a single XOR gate. As a result, this can avoid the need to use a full accumulator to add one to a running accumulated count value. In other cases, additional taps and additional XOR gates may be needed, but this is still substantially simpler to implement compared to a full accumulator. Multiple increments can easily be achieved in each reduced logic gate accumulator by exercising the sense and write amplifiers a desired number of times.

These types of reduced logic gate accumulators may be used in any suitable manner. For example, these reduced logic gate accumulators may be used in repartitioned digital pixel arrays. In some embodiments, reduced logic gate accumulators can be used with groups, mini-arrays, or other subsets of digital pixels contained in a repartitioned digital pixel array. This allows local memory elements to be distributed among and shared between the subsets of the digital pixels in the repartitioned digital pixel array. As a particular example, each 2×4 subset of digital pixels in a repartitioned digital pixel array may share a common reduced logic gate accumulator. This allows the reduced logic gate accumulators to be positioned much closer to the digital pixels in the repartitioned digital pixel array, which can provide significant reductions in power dissipation. Moreover, the compact designs of the reduced logic gate accumulators can still allow the advantages of repartitioned digital pixel arrays to be maintained.

FIG. 1 illustrates an example system 100 supporting the use of a digital pixel array according to this disclosure. As shown in FIG. 1, the system 100 includes a focusing system 102, a focal plane array 104, and a processing system 106. The focusing system 102 generally operates to focus illumination from a scene onto the focal plane array 104. The focusing system 102 may have any suitable field of view that is directed onto the focal plane array 104. The focusing system 102 includes any suitable structure(s) configured to focus illumination, such as one or more lenses, mirrors, or other optical devices.

The focal plane array 104 generally operates to capture image data related to a scene. For example, the focal plane array 104 may include a matrix or other collection of digital pixels that generate and process electrical signals representing a scene. Several of the digital pixels are shown in FIG. 1, although the size of the digital pixels is exaggerated for convenience here. The focal plane array 104 may capture image data in any suitable spectrum or spectra, such as in the visible, infrared, or ultraviolet spectrum. The focal plane array 104 may also have any suitable resolution, such as when the focal plane array 104 includes a collection of approximately 1,000 digital pixels by approximately 1,000 digital pixels (although other collection sizes may be used). The focal plane array 104 includes any suitable collection of digital pixels configured to capture image data. The focal plane array 104 may also include additional components that facilitate the receipt and output of information, such as read-out integrated circuits (ROICs). In some embodiments, the focal plane array 104 may represent a repartitioned digital pixel array that separates the front-end circuits of the digital pixels from the back-end circuits of the digital pixels.

As described in more detail below, the digital pixels of the focal plane array 104 include photodetectors that capture illumination from a scene and generate electrical currents. For each digital pixel, the electrical current can be used to charge an integration capacitor, and a voltage stored on the integration capacitor can be compared to a reference voltage by a comparator. The comparator can detect when the voltage stored on the integration capacitor meets or exceeds the reference voltage, at which point the integration capacitor can be reset. A RAM-based accumulator can be used to count the number of times that the integration capacitor is charged and reset during each of one or more sampling periods. The accumulator can be implemented using memory elements of a RAM that store an encoded version of a current accumulated count value, amplifiers that are used to control the RAM, and reduced logic (possibly a single XOR gate) that is used to increment or otherwise increase the current accumulated count value in order to produce an updated accumulated count value that is stored in the memory elements of the RAM.

The processing system 106 receives outputs from the focal plane array 104 and processes the information. For example, the processing system 106 may process image data generated by the focal plane array 104 in order to generate visual images for presentation to one or more personnel, such as on a display 108. However, the processing system 106 may use the image data generated by the focal plane array 104 in any other suitable manner.

The processing system 106 includes any suitable structure configured to process information from a focal plane array or other imaging system. For instance, the processing system 106 may include one or more processing devices 110, such as one or more microprocessors, microcontrollers, digital signal processors, field programmable gate arrays, application specific integrated circuits, or discrete logic devices. The processing system 106 may also include one or more memories 112, such as a random access memory, read only memory, hard drive, Flash memory, optical disc, or other suitable volatile or non-volatile storage device(s). The processing system 106 may further include one or more interfaces 114 that support communications with other systems or devices, such as a network interface card or a wireless transceiver facilitating communications over a wired or wireless network or a direct connection. The display 108 includes any suitable device configured to graphically present information.

Although FIG. 1 illustrates one example of a system 100 supporting the use of a digital pixel array, various changes may be made to FIG. 1. For example, various components in FIG. 1 may be combined, further subdivided, replicated, omitted, or rearranged and additional components may be added according to particular needs. Also, FIG. 1 illustrates one example type of system in which a digital pixel architecture including reduced logic gate accumulators may be used. However, the digital pixel architecture may be used in any other suitable device or system. In addition, one or more reduced logic gate accumulators may be used in any other suitable architectures, devices, or systems (whether or not those architectures, devices, or systems include digital pixels or are used for imaging purposes).

Figure 2:
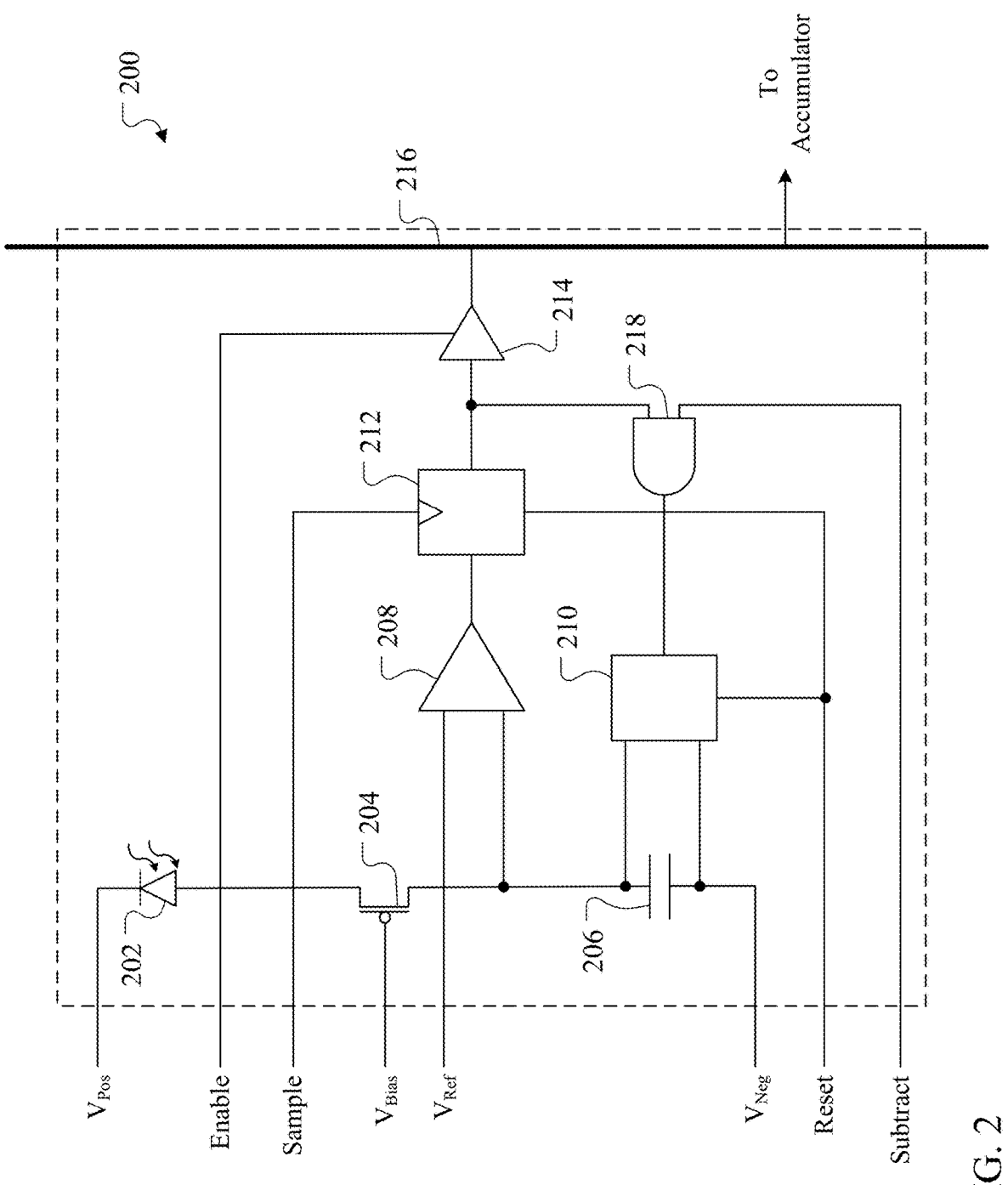
FIG. 2 illustrates an example architecture of a digital pixel according to this disclosure.

FIG. 2 illustrates an example architecture of a digital pixel 200 according to this disclosure. An instance of the digital pixel 200 shown in FIG. 2 may, for example, represent (or be used as at least part of) each digital pixel of the focal plane array 104 in the system 100 shown in FIG. 1. Thus, different digital pixels of the focal plane array 104 may include different instances of the digital pixel 200 shown in FIG. 2. However, the digital pixel 200 shown in FIG. 2 may be used with any other suitable devices and in any other suitable systems.

As shown in FIG. 2, the digital pixel 200 includes a photodetector 202, which generally operates to produce an electrical current based on received illumination. The photodetector 202 includes any suitable structure configured to generate an electrical current based on received illumination, such as a photodiode. In some cases, the photodetector 202 may represent a photodiode or other structure that can sense illumination in a specified wavelength range or band, such as in the visible, infrared, or ultraviolet spectrum. The photodetector 202 here is coupled to receive a positive supply voltage $V_{Pos}$, which may be provided by any suitable voltage source.

Generation of the electrical current by the photodetector 202 is controlled using a switch 204, which in this example is implemented using a transistor. A gate of the transistor forming the switch 204 can receive a bias voltage $V_{Bias}$, which may be provided by any suitable voltage source. The switch 204 includes any suitable structure configured to selectively form and break an electrical connection. When permitted by the switch 204, the electrical current generated by the photodetector 202 is provided to an integration capacitor 206, which can store an electrical charge that varies based on the electrical current received by the integration capacitor 206 from the photodetector 202. The integration capacitor 206 here is also coupled to receive a negative supply voltage $V_{Neg}$, which may be provided by any suitable voltage source or may represent a ground voltage. The integration capacitor 206 includes any suitable capacitive structure configured to store an electrical charge.

The voltage stored on the integration capacitor 206 is provided to a comparator 208, which also receives a reference voltage $V_{Ref}$ (which may be provided by any suitable voltage source). The comparator 208 compares the voltage stored on the integration capacitor 206 and the reference voltage $V_{Ref}$ and generates a digital output based on the comparison. For example, when the capacitor voltage does not meet or exceed the reference voltage $V_{Ref}$, the comparator 208 may output a low logic signal. When the capacitor voltage meets or exceeds the reference voltage $V_{Ref}$, the comparator 208 may output a high logic signal. The comparator 208 includes any suitable structure configured to compare electrical signals.

The output from the comparator 208 is used to control a charge removal circuit 210. The charge removal circuit 210 is configured to selectively discharge the integration capacitor 206, thereby removing the stored charge generated by the electrical current from the photodetector 202. The charge removal circuit 210 includes any suitable structure configured to discharge an integration capacitor, such as a transistor or other switch that is coupled in parallel across the integration capacitor 206. In those embodiments, making the transistor conductive or otherwise closing the switch forming the charge removal circuit 210 short-circuits or bypasses the integration capacitor 206, which allows the integration capacitor 206 to be discharged down to the negative supply voltage $V_{Neg}$.

In this configuration, the integration capacitor 206 may initially have a voltage equivalent to the negative supply voltage $V_{Neg}$ at the beginning of a sampling period. The switch 204 may be closed at the beginning of the sampling period, and the photodetector 202 can provide electrical current to the integration capacitor 206 during the sampling period. This charges the integration capacitor 206, and the charging can continue until the voltage on the integration capacitor 206 meets or exceeds the reference voltage $V_{Ref}$. When this occurs, the comparator 208 toggles its output, which causes the charge removal circuit 210 to discharge the integration capacitor 206. The discharging causes the stored voltage on the integration capacitor 206 to drop below the reference voltage $V_{Ref}$, which causes the comparator 208 to toggle its output again (effectively generating a pulse). This causes the charge removal circuit 210 to stop discharging the integration capacitor 206, and the integration capacitor 206 can again be charged using the electrical current from the photodetector 202. This can occur any number of times during the sampling period, and the pulses in the output of the comparator 208 indicate the number of times that the integration capacitor 206 is reset (which is proportional to the amount of photocurrent generated by the photodetector 202). The sampling period can also be repeated any number of times as needed or desired.

In this example, the output of the comparator 208 can be temporarily stored using a digital storage element 212. The digital storage element 212 can be used to sample and hold the output of the comparator 208 based on a control signal Sample. The sampled output of the comparator 208 can be used to control the charge removal circuit 210. The sampled output of the comparator 208 can also be provided to a gate 214, which can provide the sampled output of the comparator 208 onto at least one data line 216 for use. In some cases, the gate 214 may selectively provide the sampled output of the comparator 208 onto the data line 216 under the control of an enable signal Enable. The data line 216 is coupled to a RAM-based accumulator, which can count the number of times that the integration capacitor 206 is reset during each sampling period by counting the number of pulses contained in the output of the comparator 208. As described below, in some cases, multiple digital pixels 200 may be coupled to the same RAM-based accumulator via the data line 216. The digital storage element 212 includes any suitable structure configured to sample and hold a digital value, such as a latch. The gate 214 includes any suitable structure configured to output a digital value over a signal line, such as a tri-state gate. The data line 216 includes any suitable structure configured to transport an electrical signal, such as a wire or electrical trace.

The charge removal circuit 210 and the digital storage element 212 in this example can be controlled using a reset signal Reset. In some cases, an AND gate 218 may be used to control the charge removal circuit 210. In the illustrated embodiment, the AND gate 218 receives the output of the comparator 208 as captured by the digital storage element 212 and a signal Subtract. The Subtract signal can be used to control if and when the charge removal circuit 210 is triggered to discharge the integration capacitor 206.

Note that additional details regarding the design and operation of the digital pixel 200 can be found in U.S. Pat. No. 9,154,713 (which is hereby incorporated by reference in its entirety). Also note that additional components and operations that may be included in or performed by the digital pixel 200 can be found in U.S. Pat. No. 9,154,713. In general, the digital pixel 200 shown here is merely meant to illustrate one example type of digital pixel that may be used with a reduced logic gate accumulator. However, reduced logic gate accumulators designed in accordance with this disclosure may be used with any other suitable digital pixels or other circuits, which may or may not relate to digital imaging.

Although FIG. 2 illustrates one example of an architecture of a digital pixel 200, various changes may be made to FIG. 2. For example, various components in FIG. 2 may be combined, further subdivided, replicated, omitted, or rearranged and additional components may be added according to particular needs. Also, while specific components in the digital pixel 200 are shown in FIG. 2, other circuit components configured to perform the same or similar functions may be used here.

Figure 3:
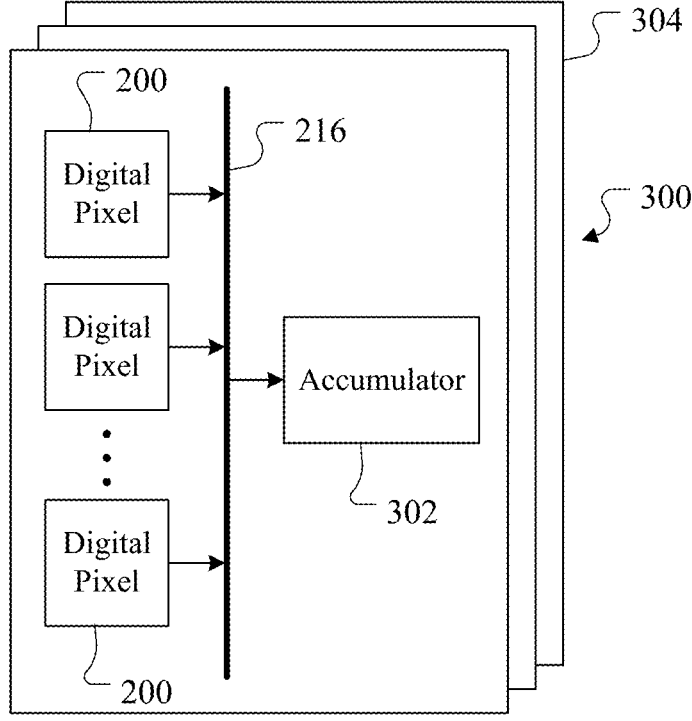
FIG. 3 illustrates an example architecture of a digital pixel array according to this disclosure.

FIG. 3 illustrates an example architecture of a digital pixel array 300 according to this disclosure. The digital pixel array 300 may, for instance, represent the focal plane array 104 in the system 100 shown in FIG. 1. However, the digital pixel array 300 shown in FIG. 3 may be used with any other suitable devices and in any other suitable systems.

As shown in FIG. 3, the digital pixel array 300 includes multiple digital pixels 200 that can communicate over at least one data line 216 with an accumulator 302. As described below, the accumulator 302 can be used to generate count values, such as by accumulating the number of times that the comparator 208 of a digital pixel 200 generates pulses indicating that the integration capacitor 206 of that digital pixel 200 has been reset. In the context of the digital pixel array 300, this can be used to generate image data based on illumination received by the photodetectors 202 of the digital pixels 200.

As can be seen in FIG. 3, a collection of multiple digital pixels 200 and an associated accumulator 302 may form a subcircuit 304 in the digital pixel array 300. The subcircuit 304 may be replicated any number of times within the digital pixel array 300, and the various subcircuits 304 can include various subsets of the digital pixels 200 of the digital pixel array 300. As a particular example, each subcircuit 304 may include a 2×4 subset of digital pixels 200. The number of subcircuits 304 can depend on the number of digital pixels 200 within the digital pixel array 300.

As described in more detail below, each accumulator 302 may represent a RAM-based accumulator, which can be used to count the number of times that the integration capacitor 206 of at least one digital pixel 200 is reset during each of one or more sampling periods. Each accumulator 302 can be implemented using memory elements of a RAM that store a current accumulated count value, amplifiers that are used to control the RAM, and reduced logic that is used to increment or otherwise increase the current accumulated count value in order to produce an updated accumulated count value (which is stored in the memory elements of the RAM). In some cases, each accumulator 302 can represent a local accumulator and can be positioned relatively physically closer to the associated digital pixels 200 of the subcircuit 304, which can facilitate reduced power dissipation since there are shorter electrical pathways between each accumulator 302 and its associated digital pixels 200. Moreover, the ability to implement each accumulator 302 using a reduced number of logic gates, which reduces the on-chip area occupied by the accumulator 302 (relative to cases where half adder circuits are implemented), allows for one or more accumulators 302 to be implemented in repartitioned digital pixel arrays or other circuits in which space is limited. In some embodiments, a single accumulator 302 may be implemented for multiple digital pixels. The reduced logic and size of the accumulator 302 allow for a larger real estate of the active area of the focal plane array 104 to be used for digital pixels 200, and the accumulator 302 can be placed physically closer (in the context of spacing on the chip) to digital pixels 200. Also, in some embodiments, the accumulator 302 is physically disposed in the active area of the focal plane array 104 that also includes the digital pixels 200. In other embodiments, the accumulator 302 is disposed outside the active area of the focal plane array 104 that includes the digital pixels 200.

Although FIG. 3 illustrates one example of an architecture of a digital pixel array 300, various changes may be made to FIG. 3. For example, various components in FIG. 3 may be combined, further subdivided, replicated, omitted, or rearranged and additional components may be added according to particular needs. Also, while specific components in the digital pixel array 300 are shown in FIG. 3, other circuit components configured to perform the same or similar functions may be used here.

Figure 4:
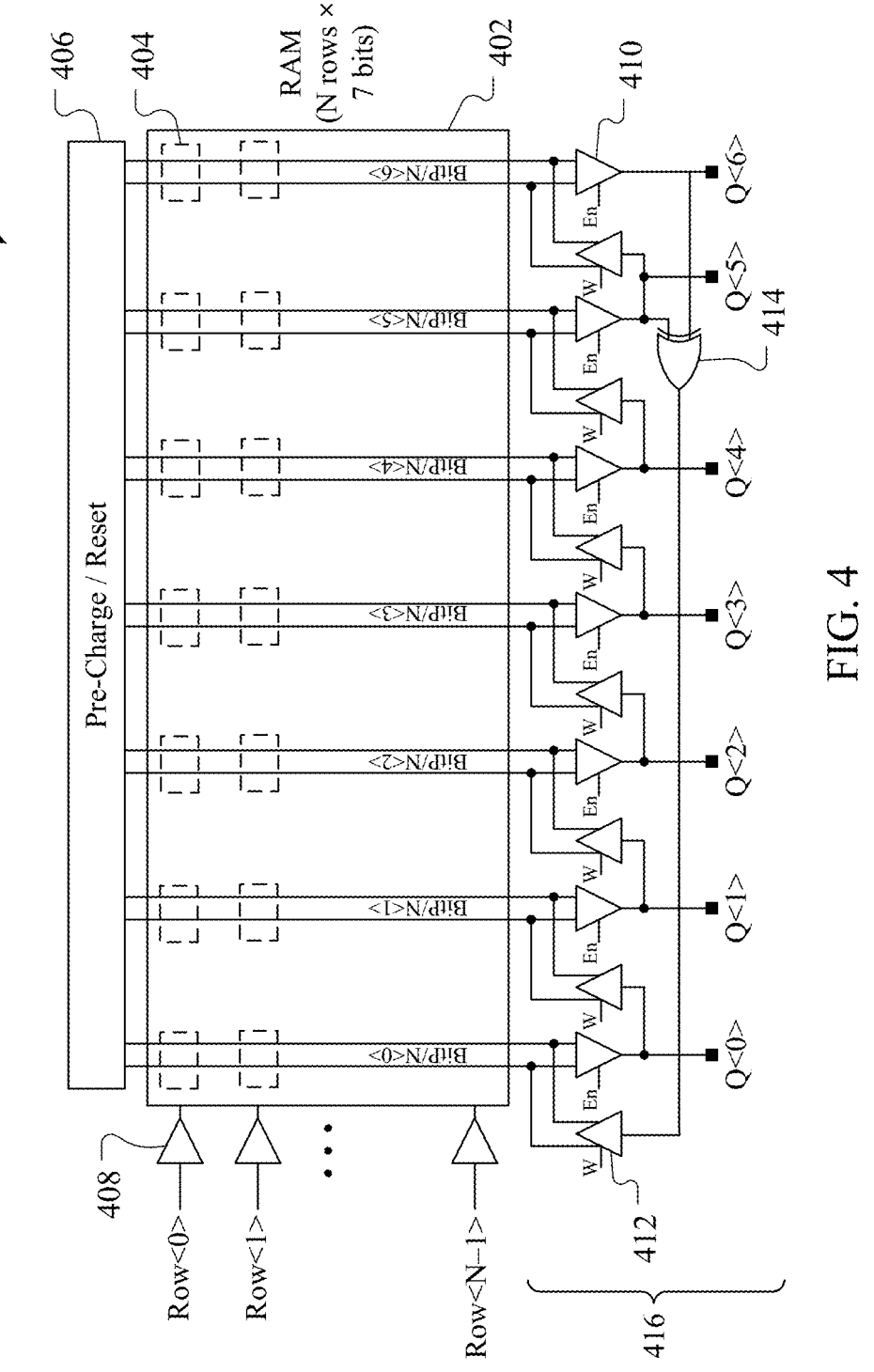
FIG. 4 illustrates an example reduced logic gate accumulator for use in a digital pixel architecture or other circuit according to this disclosure.

FIG. 4 illustrates an example reduced logic gate accumulator 302 for use in a digital pixel architecture or other circuit according to this disclosure. For ease of explanation, the reduced logic gate accumulator 302 is described as being used with at least one digital pixel 200 as shown in FIG. 2 within the digital pixel array 300 as shown in FIG. 3. However, the reduced logic gate accumulator 302 may be used in any other suitable devices or systems and need not be used for imaging purposes.

As shown in FIG. 4, the reduced logic gate accumulator 302 includes a random access memory 402. The random access memory 402 includes multiple memory elements 404, only some of which are shown in FIG. 4 for convenience. Each memory element 404 can be used to store a data bit of an encoded version of an accumulated count value. The memory elements 404 can be arranged in rows and columns within the random access memory 402. In this example, the random access memory 402 is used to store up to N seven-bit values, so there are N rows and seven columns of memory elements 404. However, the random access memory 402 may be used to store any suitable number of values, and each of the values may have any suitable number of bits.

A pre-charge and reset circuit 406 is used to pre-charge the memory elements 404 in the random access memory 402 during read operations and to help reset the memory elements 404 in the random access memory 402 during write operations. Each row of the random access memory 402 is associated with a row driver 408, which is used to drive a word line for that row in the random access memory 402. In some embodiments, each row of the random access memory 402 can have its driver 408 driven by the output of a different digital pixel 200. Each column of the random access memory 402 is associated with two electrical lines coupled to the pre-charge and reset circuit 406, and these two electrical lines represent bit lines for that column in the random access memory 402. Each column of the random access memory 402 is associated with a sense amplifier 410 used during read operations and a write amplifier 412 used during write operations. The pre-charge and reset circuit 406 includes any suitable structure configured to generate voltages used during read or write operations for memory elements 404. Each amplifier 408-412 includes any suitable structure configured to drive a signal line during read or write operations for a memory element 404.

During a read operation, the appropriate driver 408 can energize the word line for a row of memory elements 404 being read. For each column of that row, the corresponding sense amplifier 410 can be used to determine which bit line is pulled down. If the left bit line is pulled down, this may indicate that the memory element 404 in that column is storing a "0" bit. If the right bit line is pulled down, this may indicate that the memory element 404 in that column is storing a "1" bit. During a write operation, the appropriate driver 408 can energize the word line for a row of memory elements 404 being written to, and the pre-charge and reset circuit 406 or the write amplifier 412 can energize the bit lines for each column of that row. This overwrites whatever bit values are currently stored by the memory elements 404 of that row and programs each memory element 404 of that row to store a "0" or "1" bit value based on the voltages applied over the bit lines of the associated column. When the word line for a row of memory elements 404 is not being driven, the memory elements 404 in that row are holding their current bit values.

As can be seen in FIG. 4, the memory elements 404 in each row of the random access memory 402 and the amplifiers 410-412 form a type of shift register. That is, a data bit in the memory element 404 in the first column of a row in the random access memory 402 can be read using the first sense amplifier 410 and then written to the memory element 404 in the second column of the same row in the random access memory 402 using the second write amplifier 412. The data bit in the memory element 404 in the second column of the row in the random access memory 402 can be read using the second sense amplifier 410 and then written to the memory element 404 in the third column of the same row in the random access memory 402 using the third write amplifier 412. This can continue until the data bit is read from the memory element 404 in the last column of the row.

In FIG. 4, the data bit that is written into the memory element 404 in the first column of a row in the random access memory 402 by the first write amplifier 412 is generated using an XOR gate 414. The XOR gate 414 generates a feedback bit based on inputs obtained from two tap points in the shift register, and that feedback bit is shifted into the shift register using the first write amplifier 412. Because the input to the shift register is based on the prior state of the shift register, the shift register here is said to represent a linear-feedback shift register (LFSR). The linear-feedback shift register within the accumulator 302 therefore supports encoding of each current accumulated count value in the memory elements 404 in a row of the random access memory 402 using LFSR encoding (although other encodings like Johnson encoding may be used as noted above). The shift register and the XOR gate 414 here are said to form an accumulator path 416 within the accumulator 302. The accumulator path 416 is responsible for updating the current accumulated count value stored in the random access memory 402 and storing the updated accumulated count value back into the random access memory 402.

One or more encoded accumulated count values are defined based on the data bits stored in the memory elements 404 in one or more rows of the random access memory 402, where each count value is defined based on the bits stored in one row of the random access memory 402. Each encoded count value in this example represents a seven-bit value defined using bits Q<6> through Q<0>, where Q<6> represents the most significant bit and Q<0> represents the least significant bit. However, count values of other lengths may be supported by the random access memory 402. Each count value can be generated by incrementing or otherwise increasing a current count value contained in one row of the random access memory 402 to produce another count value that is stored back in the same row of the random access memory 402. This increment or increase is accomplished using the accumulator path 416 of the accumulator 302.

Thus, when the comparator 208 of a digital pixel 200 outputs a low value, the corresponding row of the random access memory 402 may be held in its current state, which identifies a current accumulated count value in an encoded form. When the comparator 208 of the digital pixel 200 outputs a high value, the corresponding row of the random access memory 402 can undergo an increment or other increase. This involves reading the current accumulated count value from the row of memory elements 404 in the random access memory 402, shifting the current accumulated count value to the right, and storing the shifted accumulated count value back into the same row of memory elements 404 in the random access memory 402. This also involves shifting the output of the XOR gate 414 into the first memory element 404 in the same row of memory elements 404 in the random access memory 402. As a result, it is possible to accumulate a count value in each row of the random access memory 402, where the accumulator path 416 uses a substantially reduced number of logic gates (a single gate 414 in this example).

Note that the number of XOR gates 414 and the tap points for the XOR gate(s) 414 within the accumulator path 416 can vary based on the number of bits contained in the count value in each row of the random access memory 402 and the type of encoding being used. For example, when LFSR encoding is used, the accumulator path 416 can be configured in the following manner based on the number of bits in a count value. The feedback bit that is shifted into the first memory element 404 of a row in the random access memory 402 can be defined using a feedback polynomial, where the feedback polynomial is based on which taps (bits) are used to produce the feedback bit. As particular examples, if taps are used to provide the fifth and sixth bits to a single XOR gate 414, the feedback polynomial may be expressed as $x^6+x^5+1$. If taps are used to provide the twelfth, eleventh, tenth, and fourth bits to a chain of XOR gates 414, the feedback polynomial may be expressed as $x^{12}+x^{11}+x^{10}+x^4+1$. Thus, the number of XOR gates 414 and the taps for those XOR gates 414 may be defined in the following manner for LFSR encoding based on the number of bits in a count value.

| Bits | Feedback Polynomial | Tap Points |
|---|---|---|
| 2 | $x^2 + x^1 + 1$ | 11 |
| 3 | $x^3 + x^2 + 1$ | 110 |
| 4 | $x^4 + x^3 + 1$ | 1100 |
| 5 | $x^5 + x^3 + 1$ | 10100 |
| 6 | $x^6 + x^5 + 1$ | 110000 |
| 7 | $x^7 + x^6 + 1$ | 1100000 |
| 8 | $x^8 + x^6 + x^5 + x^4 + 1$ | 10111000 |
| 9 | $x^9 + x^5 + 1$ | 100010000 |
| 10 | $x^{10} + x^7 + 1$ | 1001000000 |
| 11 | $x^{11} + x^9 + 1$ | 10100000000 |
| 12 | $x^{12} + x^{11} + x^{10} + x^4 + 1$ | 111000001000 |
| 13 | $x^{13} + x^{12} + x^{11} + x^8 + 1$ | 1110010000000 |
| 14 | $x^{14} + x^{13} + x^{12} + x^2 + 1$ | 11100000000010 |
| 15 | $x^{15} + x^{14} + 1$ | 110000000000000 |
| 16 | $x^{16} + x^{15} + x^{13} + x^4 + 1$ | 1101000000001000 |
| 17 | $x^{17} + x^{14} + 1$ | 10010000000000000 |
| 18 | $x^{18} + x^{11} + 1$ | 100000010000000000 |
| 19 | $x^{19} + x^{18} + x^{17} + x^{14} + 1$ | 1110010000000000000 |
| 20 | $x^{20} + x^{17} + 1$ | 10010000000000000000 |
| 21 | $x^{21} + x^{19} + 1$ | 101000000000000000000 |
| 22 | $x^{22} + x^{21} + 1$ | 1100000000000000000000 |
| 23 | $x^{23} + x^{18} + 1$ | 10000100000000000000000 |
| 24 | $x^{24} + x^{23} + x^{22} + x^{17} + 1$ | 111000010000000000000000 |

When two x terms are included in a feedback polynomial, one XOR gate 414 may be used in the accumulator path 416. When four x terms are included in a feedback polynomial, three XOR gates 414 may be used in the accumulator path 416. In some cases, the three XOR gates 414 may be arranged serially, where a first XOR gate 414 receives two bit values, a second XOR gate receives a third bit value and an output of the first XOR gate 414, and a third XOR gate receives a fourth bit value and an output of the second XOR gate 414.

Note that the current count value in a row of the random access memory 402 can be incremented once by shifting the bits of the current value to the right one position and shifting one new bit value into the first column of that row, thereby storing an updated count value in that row. To increase the current count value in a row of the random access memory 402 by more than one value, the same process may be repeated multiple times. That is, the current value can be incremented once by shifting the bits of the current value to the right one position and shifting one new bit value into the first column of that row, thereby storing a first updated count value in that row. The process can then be repeated by shifting the bits of the first updated count value to the right one position and shifting one new bit value into the first column of that row, thereby storing a second updated count value in that row.

Although FIG. 4 illustrates one example of a reduced logic gate accumulator 302 for use in a digital pixel architecture or other circuit, various changes may be made to FIG. 4. For example, various components in FIG. 4 may be combined, further subdivided, replicated, omitted, or rearranged and additional components may be added according to particular needs. Also, while specific components in the reduced logic gate accumulator 302 are shown in FIG. 4, other circuit components configured to perform the same or similar functions may be used here. Further, the specific implementation of the accumulator path 416 shown here is for seven-bit count values, although other implementations of the accumulator path 416 are possible based on the encoding technique and the number of bits. In addition, while FIG. 4 assumed that the random access memory 402 is used to store multiple count values, the random access memory 402 may be used to store any suitable number of count values (including a single count value).

Figure 5:
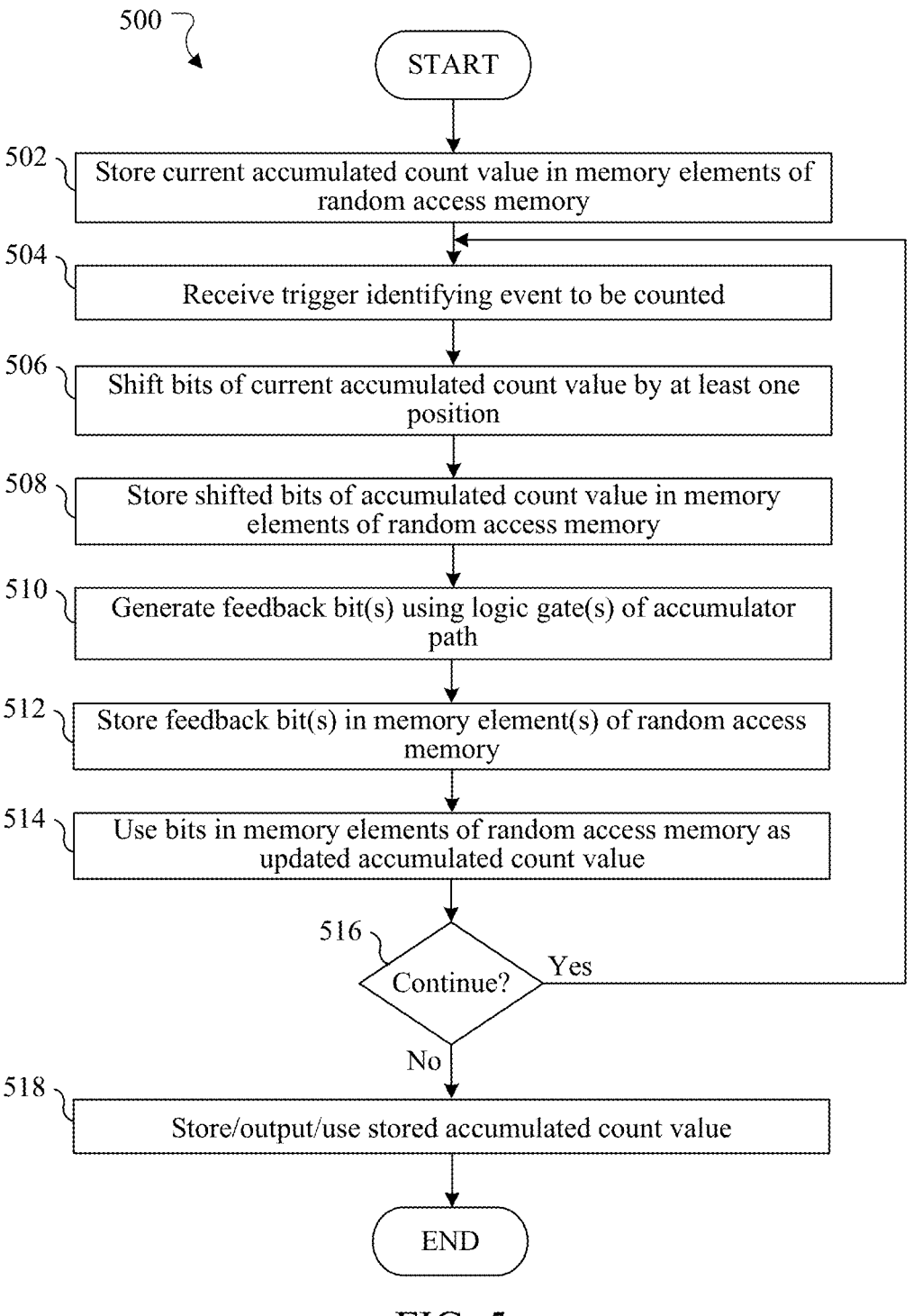
FIG. 5 illustrates an example method for using a reduced logic gate accumulator according to this disclosure.

FIG. 5 illustrates an example method 500 for using a reduced logic gate accumulator according to this disclosure. For ease of explanation, the method 500 is described as being performed using the accumulator 302 shown in FIG. 4, which may be used with one or more digital pixels 200 in a digital pixel array 300 as shown in FIGS. 2 and 3. However, the method 500 may performed using any other suitable accumulator, and the accumulator may be used in any other suitable device or system (which may or may not be used for image capture or image generation).

As shown in FIG. 5, a current accumulated count value is stored in memory elements of a random access memory at step 502. This may include, for example, the memory elements 404 in the random access memory 402 being programmed or reset to have a specific value, such as prior to or at the start of a sampling period. A trigger identifying an event to be counted is received at step 504. This may include, for example, the accumulator 302 receiving an indication that the output of a comparator 208 in a digital pixel 200 has toggled high in response to a voltage stored on an integration capacitor 206 meeting or exceeding a reference voltage. In some cases, the trigger may indicate that the current accumulated count value is to be incremented or otherwise increased by at least one.

Bits of the current accumulated count value are shifted by at least one position at step 506, and some of the shifted bits of the accumulated count value are stored in the memory elements of the random access memory at step 508. This may include, for example, a subset of the sense amplifiers 410 reading a subset of the bits of the current accumulated count value from a subset of the memory elements 404 in a row in the random access memory 402. This may also include a subset of the write amplifiers 412 writing the subset of the bits to a different (overlapping) subset of the memory elements 404 in the same row in the random access memory 402. This effectively shifts the subset of the bits of the count value within the random access memory 402. As described above, all but the most significant bit of the current accumulated count value may be read and shifted here.

At least one feedback bit is generated using one or more logic gates of an accumulator path at step 510, and the at least one feedback bit is stored in one or more of the memory elements of the random access memory at step 512. This may include, for example, the XOR gate 414 (and optionally other gates) of the accumulator path 416 generating one or more feedback bits. This may also include one of the write amplifiers 412 writing each feedback bit into a specified column of the same row in the random access memory 402.

Here, the at least one feedback bit can be inserted as the least significant bit(s) of the accumulated count value.

The bits now stored in the memory elements of the random access memory are used as an updated accumulated count value at step 514. The updated accumulated count value here can represent an encoded value, such as a value generated using LFSR encoding or Johnson encoding. If a determination is made to continue at step 516, the process returns to step 504 to await and count another event. Otherwise, the stored accumulated count value can be stored, output, or used at step 518. This may include, for example, a processing system 106 or other device or system obtaining and decoding the stored accumulated count value and using the decoded count value for any suitable purpose(s), such as generating image data or performing other functions.

Although FIG. 5 illustrates one example of a method 500 for using a reduced logic gate accumulator, various changes may be made to FIG. 5. For example, while shown as a series of steps, various steps in FIG. 5 may overlap, occur in parallel, occur in a different order, or occur any number of times (including zero times).

FIG. 6 illustrates an example method 600 for operating a digital pixel of a digital pixel array using a reduced logic gate accumulator according to this disclosure. For ease of explanation, the method 600 is described as being performed using one or more digital pixels 200 in a digital pixel array 300 as shown in FIGS. 2 and 3, which may be used with the accumulator 302 shown in FIG. 4. However, the method 600 may performed using any other suitable device or system.

As shown in FIG. 6, an electrical current is generated based on illumination received at a photodetector at step 602. This may include, for example, the photodetector 202 generating an electrical current based on received illumination. A capacitor is used to integrate the electrical current at step 604. This may include, for example, the integration capacitor 206 receiving the electrical current from the photodetector 202 and storing electrical energy based on the electrical current. The voltage stored on the integration capacitor is compared to a reference voltage in order to generate an output using a comparator at step 606. This may include, for example, the comparator 208 comparing the voltage stored on the integration capacitor 206 with the reference voltage $V_{Ref}$. This may also include the comparator 208 toggling its output when the voltage stored on the integration capacitor 206 equals or exceeds the reference voltage $V_{Ref}$, which can cause the integration capacitor 206 to be discharged (reset) and thereby cause the comparator 208 to toggle its output again. As a result, the comparator 208 can generate pulses indicating each time the voltage stored on the integration capacitor 206 meets or exceeds the reference voltage $V_{Ref}$.

A count value identifying the number of times that the comparator indicates the reference voltage is met or exceeded is generated using a RAM-based accumulator at step 608. This may include, for example, the accumulator 302 performing the method 500 as shown in FIG. 5 to generate an encoded count value in its random access memory 402 based on counting pulses generated by the comparator 208. Image data for a pixel is generated based on the count value at step 610. This may include, for example, the processing system 106 using the encoded count value in the random access memory 402 of the accumulator 302 at the end of a sampling period to generate image data. This process can be repeated across any number of digital pixels 200 in a digital pixel array 300 to produce images of any desired resolution.

Although FIG. 6 illustrates one example of a method 600 for operating a digital pixel of a digital pixel array using a reduced logic gate accumulator, various changes may be made to FIG. 6. For example, while shown as a series of steps, various steps in FIG. 6 may overlap, occur in parallel, occur in a different order, or occur any number of times (including zero times). Also, a reduced logic gate accumulator may be used in any other suitable manner.

It should be noted that while the above description often assumes that an updated count value is generated by incrementing or otherwise increasing a current count value, it is also possible to generate an updated count value by decrementing or otherwise decreasing a current count value. In those embodiments, for example, the bit values forming a current count value may be shifted to the left (rather than to the right) in FIG. 4 by reconfiguring the amplifiers 410-412 and associated electrical pathways. The accumulator path 416 may also be reconfigured to shift the feedback bit into the rightmost column (rather than into the leftmost column) in FIG. 4.

The following describes example embodiments of this disclosure that implement or relate to reduced logic gate accumulators. However, other embodiments may be used in accordance with the teachings of this disclosure.

In a first embodiment, an apparatus includes a memory having memory elements configured to store bits of a count value. The apparatus also includes sense amplifiers configured to read the bits of the count value from the memory elements and write amplifiers configured to write the bits of the count value to the memory elements. The apparatus further includes at least one logic gate configured to generate at least one feedback bit based on the count value stored in the memory elements. Some of the sense amplifiers are coupled to some of the write amplifiers in order to read and shift a subset of the bits of the count value and store the shifted subset of the bits of the count value in the memory. The shifted subset of the bits of the count value and the at least one feedback bit form an updated count value in the memory elements.

Any single one or any suitable combination of the following features may be used with the first embodiment. The at least one logic gate may represent a single logic gate. The at least one logic gate may include at least one XOR gate. The at least one logic gate may be configured to receive specified bits stored in the memory elements from multiple taps, and the multiple taps may be based on a total number of bits contained in the count value. The memory may include a random access memory, and one or more of the write amplifiers may be configured to write the at least one feedback bit to at least one of the memory elements. The sense and write amplifiers may be collectively configured to (i) shift all bits of the count value in the memory elements except a most significant bit of the count value and (ii) insert the at least one feedback bit as one or more least significant bits in the memory elements. The memory may be configured to store multiple count values. The sense amplifiers, the write amplifiers, and the at least one logic gate may collectively be configured to increment or decrement each of the count values.

In a second embodiment, a system includes a first digital pixel configured to generate pulses and a first accumulator configured to count a number of pulses generated by the first digital pixel. The first accumulator includes a memory having memory elements configured to store bits of a count value. The first accumulator also includes sense amplifiers configured to read the bits of the count value from the memory elements and write amplifiers configured to write the bits of the count value to the memory elements. The first accumulator further includes at least one logic gate configured to generate at least one feedback bit based on the count value stored in the memory elements. Some of the sense amplifiers are coupled to some of the write amplifiers in order to read and shift a subset of the bits of the count value and store the shifted subset of the bits of the count value in the memory. The shifted subset of the bits of the count value and the at least one feedback bit form an updated count value in the memory elements.

Any single one or any suitable combination of the following features may be used with the second embodiment. The first digital pixel may include a photodetector, an integration capacitor, a comparator, and a charge removal circuit. The photodetector may be configured to generate an electrical current. The integration capacitor may be configured to integrate the electrical current and generate a voltage. The comparator may be configured to compare the voltage stored on the integration capacitor and a reference voltage. The comparator may be configured to output a first digital value when the voltage stored on the integration capacitor does not meet or exceed the reference voltage, and the comparator may be configured to output a second digital value when the voltage stored on the integration capacitor meets or exceeds the reference voltage. The charge removal circuit may be configured to discharge the integration capacitor in response to the comparator outputting the second digital value. The comparator may be configured to generate the pulses. The at least one logic gate may represent a single logic gate. The at least one logic gate may include at least one XOR gate. The at least one logic gate may be configured to receive specified bits stored in the memory elements from multiple taps, and the multiple taps may be based on a total number of bits contained in the count value. The memory may include a random access memory, and one or more of the write amplifiers may be configured to write the at least one feedback bit to at least one of the memory elements. The sense and write amplifiers may be collectively configured to (i) shift all bits of the count value in the memory elements except a most significant bit of the count value and (ii) insert the at least one feedback bit as one or more least significant bits in the memory elements. The system may also include one or more additional digital pixels. The memory may be configured to store multiple count values associated with the first digital pixel and the one or more additional digital pixels. The sense amplifiers, the write amplifiers, and the at least one logic gate may collectively be configured to increment or decrement each of the count values. The system may further include a digital pixel array. The digital pixel array may include the first digital pixel, the one or more additional digital pixels, and the first accumulator as a first subcircuit. The digital pixel array may further include multiple additional subcircuits each having multiple digital pixels and an additional accumulator. Each accumulator may be positioned locally with the digital pixels that are coupled to the accumulator.

In a third embodiment, a method includes storing bits of a count value in memory elements of a memory, reading the bits of the count value from the memory elements using sense amplifiers, and writing the bits of the count value to the memory elements using write amplifiers. The method also includes generating at least one feedback bit based on the count value stored in the memory elements using at least one logic gate. In addition, the method includes updating the count value by using some of the sense amplifiers and some of the write amplifiers to read and shift a subset of the bits of the count value and store the shifted subset of the bits of the count value in the memory. The shifted subset of the bits of the count value and the at least one feedback bit form an updated count value in the memory elements.

Any single one or any suitable combination of the following features may be used with the third embodiment. The at least one logic gate represents a single XOR logic gate. The count value may represent a number of pulses contained in an output of a digital pixel. The method may also include using a photodetector of the digital pixel to generate an electrical current and using an integration capacitor to integrate the electrical current and generate a voltage. The method may further include using a comparator of the digital pixel to compare the voltage stored on the integration capacitor and a reference voltage. The comparator may output a first digital value when the voltage stored on the integration capacitor does not meet or exceed the reference voltage, and the comparator may output a second digital value when the voltage stored on the integration capacitor meets or exceeds the reference voltage. In addition, the method may include using a charge removal circuit of the digital pixel to discharge the integration capacitor in response to the comparator outputting the second digital value. The comparator may be configured to generate the pulses.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a memory comprising memory elements configured to store bits of a count value;
sense amplifiers configured to read the bits of the count value from the memory elements;
write amplifiers configured to write the bits of the count value to the memory elements; and
at least one logic gate configured to generate at least one feedback bit based on the count value stored in the memory elements;
wherein:
  some of the sense amplifiers are coupled to some of the write amplifiers in order to read and shift a subset of the bits of the count value and store the shifted subset of the bits of the count value in the memory; and
  the shifted subset of the bits of the count value and the at least one feedback bit form an updated count value in the memory elements.

2. The apparatus of claim 1, wherein the at least one logic gate represents a single logic gate.

3. The apparatus of claim 1, wherein the at least one logic gate comprises at least one XOR gate.

4. The apparatus of claim 1, wherein the at least one logic gate is configured to receive specified bits stored in the memory elements from multiple taps, the multiple taps based on a total number of bits contained in the count value.

5. The apparatus of claim 1, wherein:
the memory comprises a random access memory; and
one or more of the write amplifiers are configured to write the at least one feedback bit to at least one of the memory elements.

6. The apparatus of claim 1, wherein the sense and write amplifiers are collectively configured to:
shift all bits of the count value in the memory elements except a most significant bit of the count value; and
insert the at least one feedback bit as one or more least significant bits in the memory elements.

7. The apparatus of claim 1, wherein:
the memory is configured to store multiple count values; and
the sense amplifiers, the write amplifiers, and the at least one logic gate are collectively configured to increment or decrement each of the count values.

8. A system comprising:
a first digital pixel configured to generate pulses; and
a first accumulator configured to count a number of pulses generated by the first digital pixel, the first accumulator comprising:
  a memory comprising memory elements configured to store bits of a count value;
  sense amplifiers configured to read the bits of the count value from the memory elements;
  write amplifiers configured to write the bits of the count value to the memory elements; and
  at least one logic gate configured to generate at least one feedback bit based on the count value stored in the memory elements;
  wherein:
    some of the sense amplifiers are coupled to some of the write amplifiers in order to read and shift a subset of the bits of the count value and store the shifted subset of the bits of the count value in the memory; and
    the shifted subset of the bits of the count value and the at least one feedback bit form an updated count value in the memory elements.

9. The system of claim 8, wherein the first digital pixel comprises:
a photodetector configured to generate an electrical current;
an integration capacitor configured to integrate the electrical current and generate a voltage;
a comparator configured to compare the voltage stored on the integration capacitor and a reference voltage, the comparator configured to output a first digital value when the voltage stored on the integration capacitor does not meet or exceed the reference voltage, the comparator configured to output a second digital value when the voltage stored on the integration capacitor meets or exceeds the reference voltage; and
a charge removal circuit configured to discharge the integration capacitor in response to the comparator outputting the second digital value; and
wherein the comparator is configured to generate the pulses.

10. The system of claim 8, wherein the at least one logic gate represents a single logic gate.

11. The system of claim 8, wherein the at least one logic gate comprises at least one XOR gate.

12. The system of claim 8, wherein the at least one logic gate is configured to receive specified bits stored in the memory elements from multiple taps, the multiple taps based on a total number of bits contained in the count value.

13. The system of claim 8, wherein:
the memory comprises a random access memory; and
one or more of the write amplifiers are configured to write the at least one feedback bit to at least one of the memory elements.

14. The system of claim 8, wherein the sense and write amplifiers are collectively configured to:
shift all bits of the count value in the memory elements except a most significant bit of the count value; and
insert the at least one feedback bit as one or more least significant bits in the memory elements.

15. The system of claim 8, further comprising:
one or more additional digital pixels;
wherein the memory is configured to store multiple count values associated with the first digital pixel and the one or more additional digital pixels; and
wherein the sense amplifiers, the write amplifiers, and the at least one logic gate are collectively configured to increment or decrement each of the count values.

16. The system of claim 15, further comprising:
a digital pixel array comprising the first digital pixel, the one or more additional digital pixels, and the first accumulator as a first subcircuit;
wherein the digital pixel array further comprises multiple additional subcircuits each comprising multiple digital pixels and an additional accumulator.

17. The system of claim 16, wherein each accumulator is positioned locally with the digital pixels that are coupled to the accumulator.

18. A method comprising:
storing bits of a count value in memory elements of a memory;
reading the bits of the count value from the memory elements using sense amplifiers;
writing the bits of the count value to the memory elements using write amplifiers;
generating at least one feedback bit based on the count value stored in the memory elements using at least one logic gate; and updating the count value by using some of the sense amplifiers and some of the write amplifiers to read and shift a subset of the bits of the count value and store the shifted subset of the bits of the count value in the memory;

wherein the shifted subset of the bits of the count value and the at least one feedback bit form an updated count value in the memory elements.

19. The method of claim 18, wherein the at least one logic gate represents a single XOR logic gate.

20. The method of claim 18, wherein:

the count value represents a number of pulses contained in an output of a digital pixel;

the method further comprises:

using a photodetector of the digital pixel to generate an electrical current;

using an integration capacitor to integrate the electrical current and generate a voltage;

using a comparator of the digital pixel to compare the voltage stored on the integration capacitor and a reference voltage, the comparator outputting a first digital value when the voltage stored on the integration capacitor does not meet or exceed the reference voltage, the comparator outputting a second digital value when the voltage stored on the integration capacitor meets or exceeds the reference voltage; and using a charge removal circuit of the digital pixel to discharge the integration capacitor in response to the comparator outputting the second digital value; and the comparator is configured to generate the pulses.

* * * * *